United States Patent
Roozen et al.

(10) Patent No.: US 6,518,761 B2
(45) Date of Patent: Feb. 11, 2003

(54) MRI APPARATUS PROVIDED WITH AXIALLY STIFF SUSPENSION ELEMENTS FOR THE GRADIENT COIL SYSTEM

(76) Inventors: Nicolaas Bernardus Roozen, Prof. Holstlaan 6, 5656 AA Eindhoven (NL); Gerard Van Schothorst, Prof. Holstlaan 6, 5656 AA Eindhoven (NL); Hermanus Mathias Joannes Rene Soemers, Prof. Holstlaan 6, 5656 AA Eindhoven (NL)

( * ) Notice: Subject to any disclaimer, the term of this patent is extended or adjusted under 35 U.S.C. 154(b) by 0 days.

(21) Appl. No.: 10/015,710

(22) Filed: Nov. 30, 2001

(65) Prior Publication Data

US 2002/0079896 A1 Jun. 27, 2002

(30) Foreign Application Priority Data

Nov. 30, 2000 (EP) .............................................. 00204252

(51) Int. Cl.⁷ ................................................. G01V 3/00
(52) U.S. Cl. ........................................ 324/318; 324/322
(58) Field of Search .................................. 324/318, 322, 324/300, 306, 307, 309, 312, 314

(56) References Cited

U.S. PATENT DOCUMENTS

| | | | |
|---|---|---|---|
| 4,652,824 A | | 3/1987 | Oppelt ........................ 324/318 |
| 5,617,026 A | * | 4/1997 | Yoshino et al. .............. 324/318 |
| 5,698,980 A | | 12/1997 | Sellers et al. ................ 324/318 |
| 5,793,210 A | | 8/1998 | Pla et al. ..................... 324/318 |
| 6,208,141 B1 | * | 3/2001 | Amor et al. ................. 324/307 |

\* cited by examiner

Primary Examiner—Louis Arana
(74) Attorney, Agent, or Firm—John Vodopia (57) ABSTRACT

The transfer of vibrations that generate noise should be avoided in medical MRI apparatus. In accordance with the invention the gradient coil system 40 is suspended by means of suspension elements 48 whose transverse stiffness is much smaller than their axial stiffness. Such suspension elements should be attached to the coil carrier 40 at a vibration-free point, that is, a point that does not exhibit vibrations in all three co-ordinate directions. The longitudinal direction of the suspension element 48 should coincide with the vibration-free direction. Preferably, the suspension element is provided with an active drivable element 37 (a piezo element) for virtually reducing the stiffness of the suspension element in the axial direction, thus compensating also for residual vibrations that could still be present in the vibration-free direction.

8 Claims, 6 Drawing Sheets

MRI APPARATUS PROVIDED WITH AXIALLY STIFF SUSPENSION ELEMENTS FOR THE GRADIENT COIL SYSTEM

BACKGROUND OF THE INVENTION

1. Field of the Invention

The invention relates to an apparatus for forming magnetic resonance images, which apparatus includes a gradient coil system that includes a carrier on which gradient coils are arranged, said gradient coils being attached to a frame of the apparatus by way of connection means, which connection means are constructed so as to reduce the transfer of mechanical vibrations that are produced by the gradient coil system.

2. Description of the Prior Art

An MRI apparatus of this kind is known from U.S. Pat. No. 5,793,210. The MRI apparatus that is described in the cited document is provided with a gradient coil system with gradient coils that are arranged in an enclosure in which the gas pressure is lower than that of the ambient atmosphere. Coils of this kind may be arranged on a carrier which itself is attached to further parts of the MRI apparatus; the carrier is attached notably to the frame of the MRI apparatus by way of connection means.

It is a generally known fact that gradient coils in operation produce noise that is very annoying to the patients to be examined. Therefore, the technical aim is to reduce this noise as much as possible. To this end, the gradient coils in the known MRI apparatus are arranged in a vacuum atmosphere with a residual pressure such that the acoustic transfer of vibrations, arising in the gradient coils, to the surroundings is strongly reduced. Said vacuum space may be filled with a noise absorbing fiber glass material so as to reduce the transfer via this atmospheric path even further. In order to counteract the transfer of vibrations via the connection means, the connection means are constructed so as to mitigate the transfer of the vibrations that are generated by the gradient coil system. The gradient coil system is supported notably by materials that have the desired acoustic properties, for example rubber, plastic or an epoxy material, or by resilient elements that, like said materials, bear on rigid structural parts such as supports or flanges that are especially provided for this purpose.

Said known steps all have restrictive drawbacks. Said materials dampen the acoustic vibrations to a limited extent only and still allow an acoustic path through the surrounding atmosphere. Enclosing the gradient coils by means of a noise absorbing fiber material also dampens the acoustic vibrations to a limited extent only and still leaves an acoustic path through the connection means; this also holds when the gradient coils are arranged in vacuum. Moreover, arranging the gradient coil in a vacuum envelope necessitates drastic structural steps to be taken and also requires additional space; the latter is undesirable notably in the vicinity in which the coils of the MRI apparatus are situated. A flexible suspension of the gradient carrier also has the drawback that in a macroscopic sense a change of position of the gradient coils could then occur; this drawback is not imaginary, because the design of a flexible suspension always aims for maximum vibration isolation, so an as flexible as possible suspension. A macroscopic change of position has an adverse effect on the quality of imaging.

It is an object of the invention to provide an MRI apparatus of the kind set forth in which acoustic propagation to the environment of vibrations that are produced in the gradient coil system is counteracted in a different manner.

SUMMARY OF THE INVENTION

To this end, the MRI apparatus in accordance with the invention is characterized in that the connection means include a number of suspension elements, a first end of which is attached to the carrier whereas another end is attached, directly or indirectly, to the frame of the MRI apparatus, said connection means having a first mechanical stiffness in a first direction and a second, smaller stiffness in at least one direction that extends perpendicularly thereto, each of the first ends of the suspension elements being attached to a point of attachment of the carrier such that this point exhibits at least one low-vibration direction, and the connection direction between the first end and the second end of the suspension element being substantially coincident with the low-vibration direction of the point of attachment of the carrier.

The stiffness in the first direction is determined by the requirement imposed as regards positional stability, meaning that the gradient carrier must retain its position during operation from a macroscopic point of view. The stiffness in the second direction must then be much smaller than that in the first direction. The simplest form of such a suspension element has the shape of a rod that has a thickness such that its bending stiffness is much smaller than the stiffness in the axial direction, or of a rod that is attached to the surroundings in such a manner that it is capable of tilting about its point of attachment. In the latter case the transverse stiffness is even negligibly small relative to the axial stiffness. Another form of such a suspension element can be obtained by way of a notch hinge that is proportioned in such a manner that a small hinge stiffness about one axis is obtained, or by way of a combination of two notch hinges that are proportioned such that a small hinge stiffniess about two mutually perpendicular axes is obtained. Other structural elements that are known per se are also feasible for as long as the requirement is satisfied that such an element should exhibit a given degree of mechanical stiffness in one direction and a much smaller stiffness in a direction perpendicular thereto.

Generally speaking, the gradient coil system includes a carrier on which the gradient coils are mounted. The carrier is often shaped as a cylinder in which the gradient conductors and the carrier are united so as to form one rigid unit. Using said suspension elements, the location in the space of the carrier, that is, of the entire gradient coil system can be defined. Generally speaking, each point of a member that produces vibrations exhibits vibration deflections in three non-coincident directions which, moreover, exhibit mutual phase differences. The invention is based on the recognition of the fact that there are locations on a gradient carrier, notably a gradient carrier having a cylindrical shape, where in one vibration direction the amplitude is significantly lower than in the other directions. The former direction is referred to as the low-vibration direction. When the suspension element in aaccordance with the invention is attached in such a location (that is, in a location where the amplitude in one vibration direction is substantially lower than that in the other directions) and when the low-vibration direction is chosen as the direction of said suspension element, the occurrence of vibrations in the longitudinal direction of the suspension element will be much less than in the other directions, and the vibrations in said other directions will be transferred to a very small extent only by the suspension elements because these elements have a small stiffness in said directions. The transfer of the vibrations produced by the gradient coil system is thus strongly reduced. The use of a suspension element in accordance with the invention also offer the advantage that this suspension is highly unsusceptible to deviations of the axial suspension direction from the desired direction, that is, the low-vibration direction of the point of attachment. It can be demonstrated that the deviation of the reduction factor of the vibration forces that is transferred by the suspension element in the case of misalignment in the axial direction is proportional to the square of the sine of the angle of deviation. For small angles this results in a very small deviation of the reduction factor.

Preferably, for at least one of said suspension elements the ratio of the axial stiffness to the transverse stiffness is greater than 50:1. It has been found that this numerical value yields an acceptable vibration isolation for the remaining vibrations.

It may occur that the effect of the described steps in accordance with the invention is less for vibration frequencies other than the most important frequency, that is, for the frequency at which the largest acoustic energy occurs. This means that no low-vibration direction is present in the point of attachment for said other frequencies, or that a low-vibration direction that is present does not coincide with the longitudinal direction of the suspension element in accordance with the invention. In order to realize a further vibration isolation also for one or some of said other frequencies, at least one of said suspension elements is provided with an active drivable element for virtually reducing the stiffness of said suspension element in the axial direction. Said element can now be controlled in such a manner that the longitudinal displacement in the suspension element that is caused by the residual vibration is compensated by an opposed extension/reduction of the length of the active drivable element that is caused by a variation of the length of the controllable element that is induced by the driving. This results in a virtual reduction of the stiffness of the suspension element for the drive frequency (frequencies). Such an element may be formed, for example by a piezoelectric actuator or by an electromagnetic actuator. This step counteracts the transfer of said residual vibrations (in the form of forces that act on the other structural parts of the MRI apparatus).

In conformity with a preferred embodiment of the invention, the MRI apparatus is provided with a drive circuit for driving the active drivable element, which drive circuit includes a feedback circuit that is arranged between a force sensor that is provided at the area of the relevant point of attachment of the carrier and the active drivable element. The force sensor measures the transferred force in the point of attachment, notably the force in the longitudinal direction of the suspension element. The force transferred in the longitudinal direction can thus be controlled so as to be zero.

In conformity with a further embodiment of the invention, the MRI apparatus is provided with a gradient control circuit that is intended to produce the signal that generates the gradient field of the MRI apparatus, and also with a drive circuit for driving the active drivable element, which drive circuit includes a feed-forward circuit that is connected between the gradient control circuit and the active drivable element. This embodiment advantageously utilizes the a priori knowledge concerning the state of vibration of the gradient coil system. This knowledge is derived from the control signal for the gradient currents, that is, in such a manner that there is generated a compensation signal for the active drivable element, the compensating effect of the drivable element being the same as when use is made of a feedback circuit.

Another embodiment yet of the MRI apparatus in accordance with the invention is provided with a cylindrical carrier for the gradient coils, which carrier is attached to four of said suspension elements at a first end and to two further suspension elements of this kind at a second end. A gradient coil system can thus be realized with suspension elements that act as ideal notch hinges; this means that the stiffness in the directions perpendicular to the longitudinal axes is of a value that is negligibly small for all practical purposes. Consequently, in a situation where even a slight transfer of vibrations in the transverse direction is undesirable, such a transfer is optimally counteracted. Moreover, macroscopic low-frequency motions (for example, of the order of magnitude of 10 Hz) of the carrier are also effectively counteracted by such a suspension by means of six suspension elements, so that deterioration of the imaging quality of the MRI apparatus is avoided.

In another embodiment yet of the MRI apparatus in accordance with the invention at least one of said suspension elements is constructed in the form of a rod-shaped element that comprises a thickened central portion. The effect of this step in accordance with the invention consists in that the thickened portion enhances the collapsing stability of the rod. As a result of the presence of this thickened portion, the remaining, non-thickened portions may be constructed so as to be thinner than when the thickening of the central portion were omitted, so that the transverse stiffness is even further reduced.

BRIEF DESCRIPTION OF THE DRAWINGS

The invention will be described in detail hereinafter with reference to the Figures. Therein.

DETAILED DESCRIPTION OF THE PREFERRED EMBODIMENTS

Figure 1:
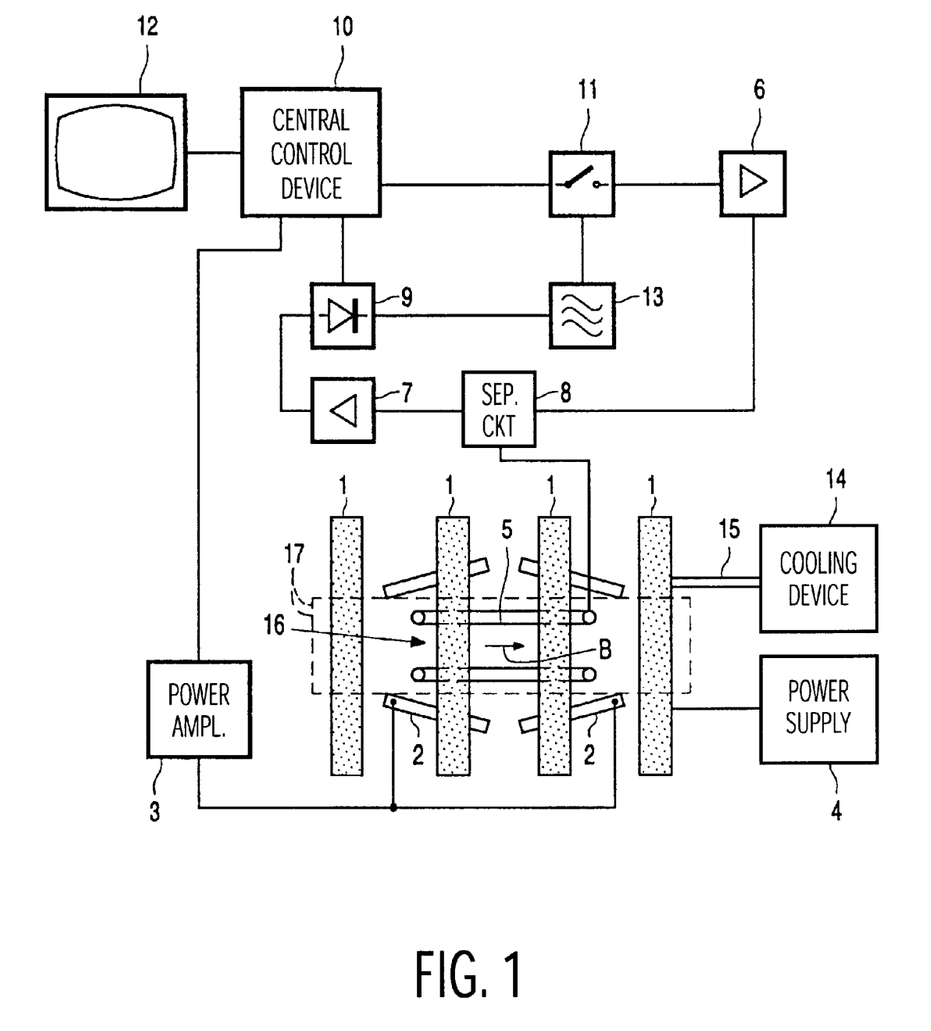
FIG. 1 is a diagrammatic representation of the general construction of a known magnetic resonance apparatus.

The magnetic resonance apparatus that is diagrammatically shown in FIG. 1 includes a first magnet system 1 for generating a steady magnetic field B, a second magnet system 2 (the gradient coil system) for generating magnetic gradient fields, a power amplifier 3 for the gradient coil system 2 and a power supply source 4 for the first magnet system 1. An RF coil 5 serves to generate an RF magnetic alternating field; to this end it is connected to an RF transmitter device which includes an RF source 6. The RF coil 5 can also be used for the detection of spin resonance signals that are generated by the RF transmitted field in an object to be examined (not shown); to this end, the RF coil is connected to an RF receiving device which includes a signal amplifier 7. The output of the signal amplifier 7 is connected to a detector circuit 9 which is connected to a central control device 10. The central control device 10 also controls a modulator 11 for the RF source 6, the power amplifier 3 and a monitor 12 for display. An RF oscillator 13 controls the modulator 11 as well as the detector 9 that processes measuring signals. A cooling device 14 with cooling ducts 15 is provided for the cooling of the magnet coils of the first magnet system 1. The RF coil 5 that is arranged within the magnet systems 1 and 2 encloses a measuring space 16 that, in the case of an apparatus for medical diagnostic measurements, is large enough to receive a patient to be examined or a part of a patient to be examined, for example the head and the neck. A steady magnetic field B, gradient fields that select object slices, and a spatially uniform RF alternating field can thus be generated in the measuring space 16. The RF coil 5 can combine the functions of transmitter coil and measuring coil; in that case a separating circuit 8 is provided so as to separate the forward signal traffic and the return signal traffic. It is alternatively possible to use different coils for the two functions; for example, surface coils can then be used as measuring coils. If desired, the coil 5 may be enclosed by a Faraday cage 17 that shields RF fields.

FIG. 2 is a diagrammatic representation of a double-notch hinge for use in a suspension element in accordance with the invention. The gradient coils in the magnetic resonance apparatus in accordance with the invention are arranged on a carrier and together constitute one rigid unit. The carrier is attached to a frame of the apparatus by way of suspension elements. In accordance with the invention the suspension elements have a first mechanical stiffness in a first direction (the axial direction) and a second, smaller stiffness in one or two directions perpendicular thereto (the transverse directions). The FIGS. 2c and 2d show an embodiment of such a suspension element that is provided with two so-called double-notch hinges.

Figure 2A:
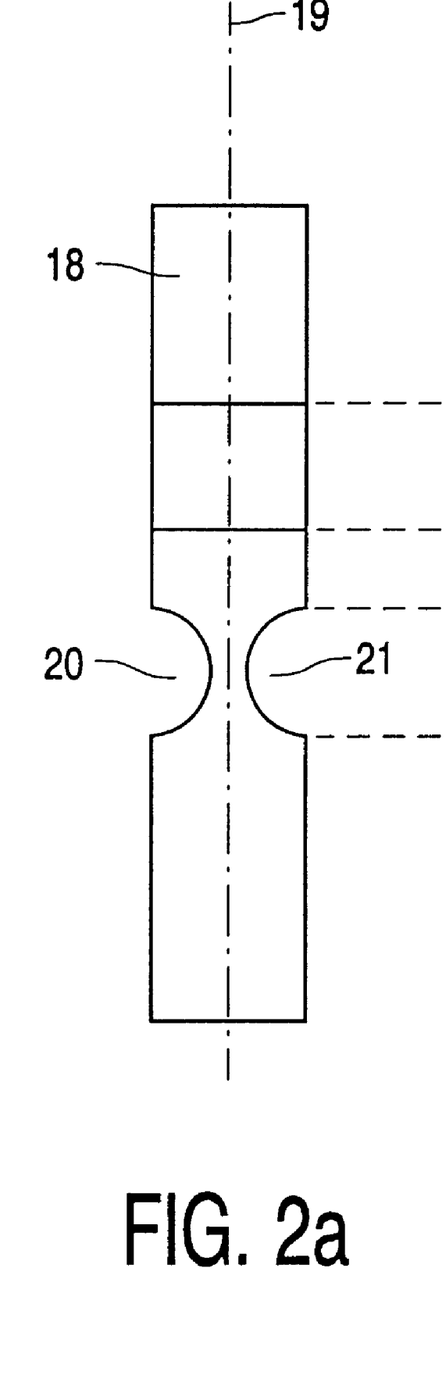
FIGS. 2a to 2d are diagrammatic representations of a double-notch hinge and a suspension element that is to be constructed by means of such a hinge in accordance with the invention.
Figure 2B:
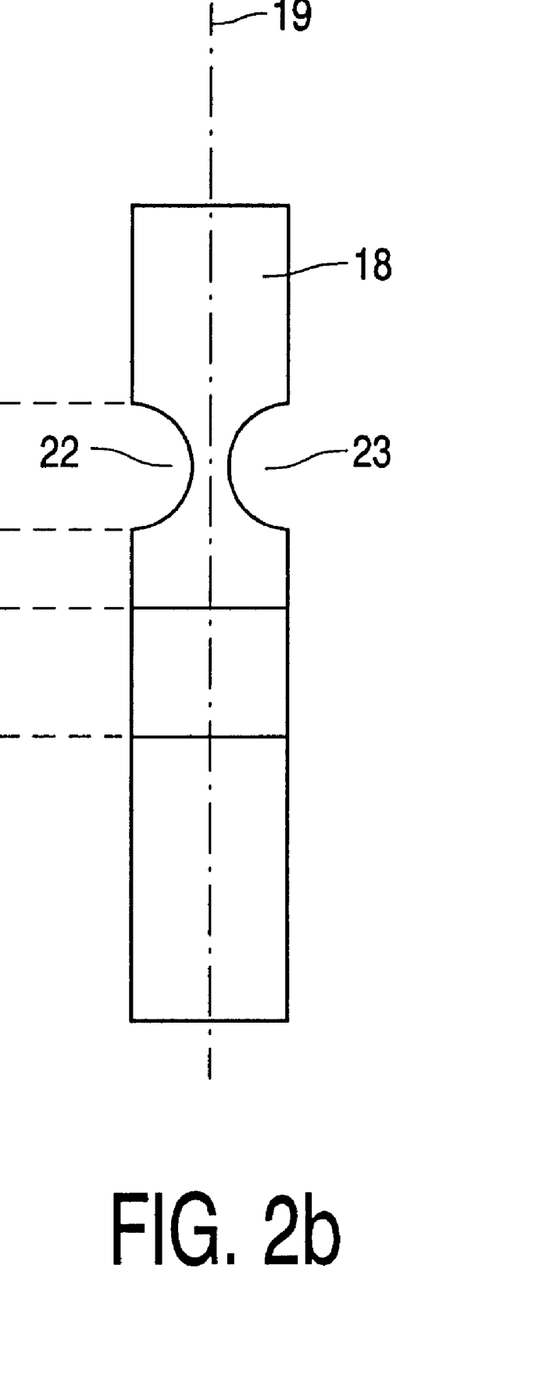

The FIGS. 2a and 2b show a double-notch hinge, FIG. 2a being a front view whereas FIG. 2b is a side elevation of FIG. 2a. The double-notch hinge shown is formed by a rod-shaped member 18 that may have a round or a square cross-section. Two mutually parallel cut-outs 20 and 21 are provided so as to extend perpendicularly to the longitudinal axis 19 of the member 18, and two mutually parallel cut-outs 22 and 23 are provided so as to extend in the direction perpendicular thereto and also perpendicular to the longitudinal axis. A small rotational stiffness is achieved by way of the smaller width of the rod at the area of the cut-outs. In order to make a double-notch hinge suitably approximate the behavior of a ball joint, it is important to realize a small distance between the cut-outs in the direction of the longitudinal axis.

Figure 2C:
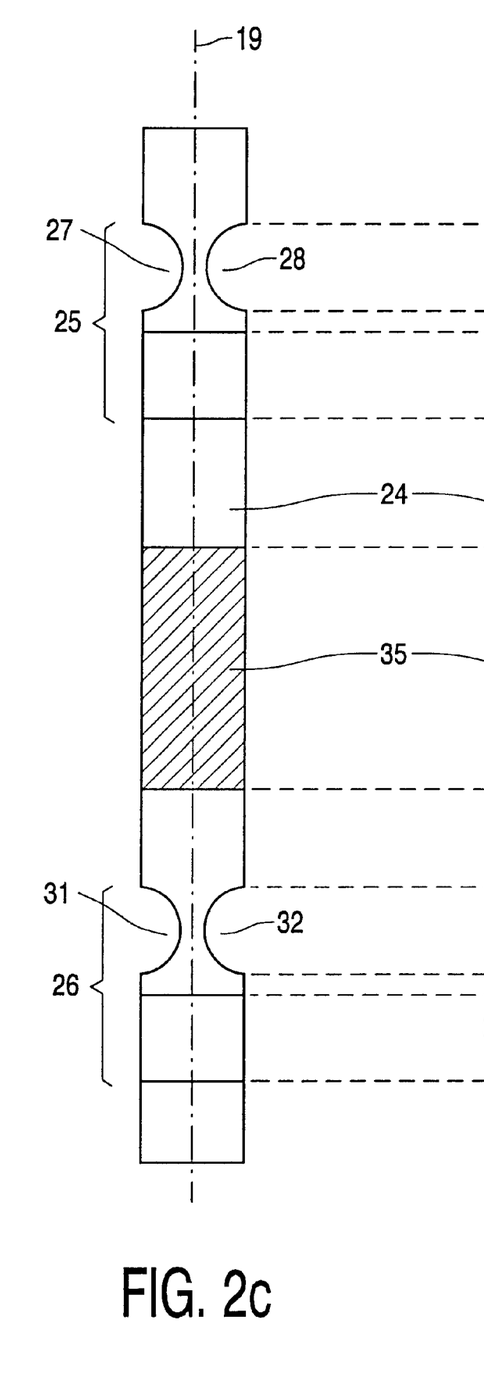
Figure 2D:
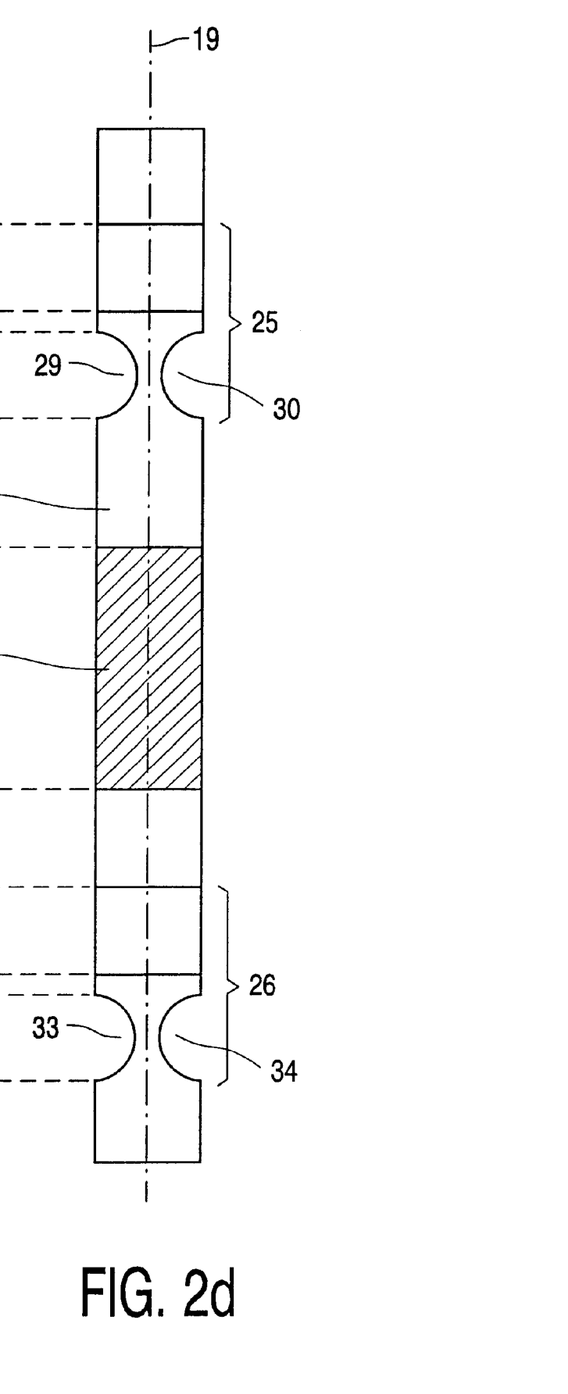

A suspension element in accordance with the invention can be realized by a combination of two double-notch hinges as described with reference to the FIGS. 2a and 2b and an intermediate rod. The FIGS. 2c and 2d show a rod-shaped member 24 of this kind, both ends of which are provided with two double-notch hinges 25 and 26 that can act approximately as a ball joint. The two double-notch hinges 25 and 26 may still have a given (slight) stiffness in the hinge direction. The suspension element that is realized by means of double-notch hinges 25 and 26 that act as ball joints thus consists of a rod-shaped member 24 that is provided with a first pair of cut-outs 27 and 28 near one of its ends and near its other end with a second pair of cut-outs 29 and 30, a third pair of cut-outs 31 and 32 and a fourth pair of cut-outs 33 and 34. The desired much smaller stiffness of this suspension element in the transverse direction is realized by the combination of the two ball joints 25 and 26 to both sides of the rod-shaped member 24. Even though a double-notch hinge still exhibits a given stiffness, because of the comparatively large distance between the two double-notch hinges 25 and 26 only a small bending angle of each hinge is required; this becomes manifest as a small transverse stiffness. This effect can be explained on the basis of the known fact that in the double-notch hinge technique the transverse stiffness is proportional to the reciprocal value of the square of the distance between the two double-notch hinges 25 and 26. Because of the comparatively large distance between the two double-notch hinges 25 and 26, a displacement that is not insignificant can still take place in the transverse direction in the case of a small bending angle.

A part of the rod-shaped member is formed by an active drivable element 35 so as to achieve virtual weakening of said suspension element in the axial direction. The active drivable member 35 is formed, for example by a piezo actuator which is capable of contraction or expansion, as is known, under the influence of an electrical voltage applied thereto. One end of the suspension element is connected to the gradient carrier whereas its other end is connected to the frame of the MRI apparatus. It is assumed that the gradient carrier has a vibration mode that exhibits mainly a vibration displacement transversely of the axial direction 19 of the rod, but also causes some residual vibration displacement in the axial direction 19 of the rod. In the absence of driving of the piezo element 35, the latter vibration component would be transferred from the suspension element to the frame of the MRI apparatus practically without damping. However, by driving the piezo element 35 with a suitable signal waveform it can be ensured that the longitudinal displacement that would occur in the suspension element due to the vibration is compensated by an opposed extension/reduction of the length of the piezo element 35 which is due to the variation of the length of the piezo element 35 that is induced by the driving. As a result, the suspension element is virtually weakened for the drive frequency (frequencies). The connection direction between the first end and the second end of the suspension element, that is, the longitudinal axis 19 of the rod, should then be the same as the low-vibration direction of the point of attachment where the suspension element is attached to the carrier.

Figure 3:
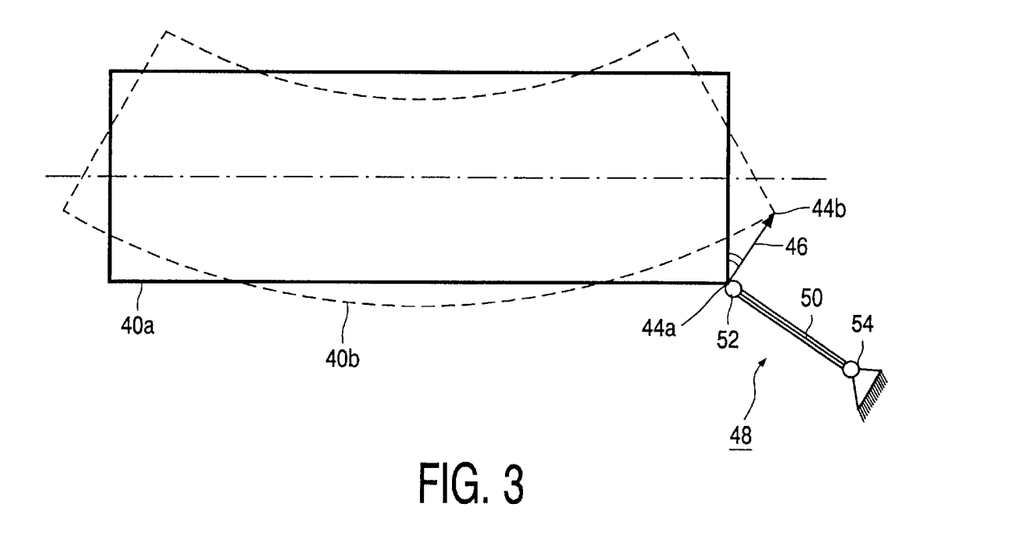
FIG. 3 is a diagrammatic representation of a carrier for a gradient coil system in the case of deformation due to vibrations.

FIG. 3 is a diagrammatic representation of a carrier for a gradient coil system in the case of deformation due to vibrations. A carrier of this kind typically has a cylindrical shape, the side elevation of which is shown in this Figure. This Figure does not show the gradient coils that form one rigid unit together with the carrier. The non-deformed cylindrical carrier that is represented by a solid line in the Figure is denoted by the reference numeral 40a whereas the deformed carrier that is represented by a dashed line is denoted by the reference numeral 40b. The deformation is due to a vibration whereto the carrier is subject; in an important mode of vibration such a vibration has a frequency of typically 700 Hz.

Because of the vibration, all points experience a displacement relative to their stationary position. For example, the edge point 44a of the non-deformed carrier 40a is displaced to a position 44b by the vibration. This displacement is represented by the displacement vector 46 that is associated with the points 44a and 44b. This displacement vector encloses an angle of approximately 45 degrees relative to the cylinder axis of the non-deformed carrier 40a. If this is the sole vibration direction of said point at the frequency considered (that is, if a vibration direction exists exclusively in the plane of drawing and there is no vibration direction that extends perpendicularly to the plane of drawing), the direction perpendicular to the vector 46 in the plane of drawing is a low-vibration direction.

The suspension in conformity with the idea of the invention can be realized by way of a rod-shaped suspension element 48 that consists of a rod-shaped member 50 whose longitudinal direction extends perpendicularly to the vector 46 and each end of which is provided with a ball joint 50, 52, respectively, that is constructed, for example, as described with reference to FIG. 2. The longitudinal direction of the suspension element 50 thus encloses an angle of 45 degrees relative to the cylinder axis of the non-deformed carrier 40a. The ball joint 52 is attached to a point of attachment 44a of the carrier 40a and the ball joint 54 is attached to a fixed point that does not vibrate, for example the frame of the MRI apparatus. It is to be noted that the ratio of the vibration displacement as represented by the vector 46 to the length of the rod-shaped member 50 is not realistic in FIG. 3. In reality the vector 46 will be many times smaller than the rod-shaped member 50.

Even though the embodiment of the suspension element as described with reference to FIG. 3 involves a rigid rod with two ball joints, it is to be noted that it is also possible to select a different configuration of the suspension element. For example, use can be made of a thin flexible rod whose flexibility in the direction transversely of the longitudinal direction exhibits the same functionality as the described embodiment. One end of the thin rod is then connected to the edge point 44a whereas the other end is attached to the point where the ball joint 54 is attached in FIG. 3. If the length of the flexible rod were to become excessive, so that there is a risk of collapse in response to loading, the central portion of the rod could be constructed so as to be thicker so that only the remaining thin portions at the two ends are subject to bending.

Figure 4:
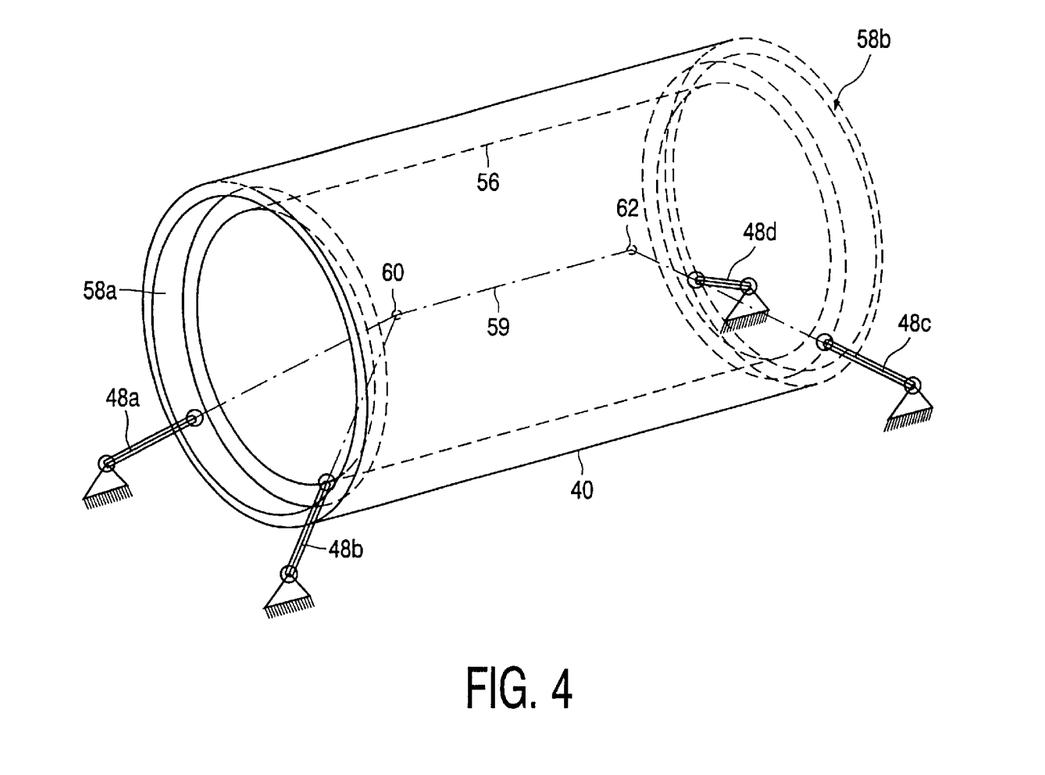
FIG. 4 shows a cylindrical carrier for a gradient coil system that is suspended by means of four suspension elements in accordance with the invention.

FIG. 4 is a perspective view of a cylindrical carrier for a gradient coil system that is suspended by way of four suspension elements in accordance with the invention. The carrier 40 in this Figure has a predominantly cylindrical shape with a thickened wall 56 at the center and slightly thinner wall portions 58a and 58b at the ends. The suspension elements 48a, 48b, 48c and 48d are attached to the thinner portions 58a and 58b. Each of the suspension elements shown may be constructed in the same way as the suspension element 48 described with reference to FIG. 3. For the suspension of a body with a fixed position in space it is in principle necessary to suspend said member in six independent directions by means of six suspension elements in accordance with the invention, that is, by means of suspension elements whose transverse stiffness is negligibly small in comparison with their axial stiffness. For the present suspension elements 48a to 48d, however, it was decided to make the stiffness of the ball joints at the ends not negligibly small; instead a given finite stiffness is maintained in a plane perpendicular to the longitudinal direction of the rod-shaped members. 10:1 is a suitable value for the ratio of the stiffness for which it suffices to use four suspension elements. The effect of this finite stiffness is that the carrier 40 can be suspended by means of a number of suspension elements that is smaller than six, that is, four suspension elements in the situation shown. The rods are oriented in such a manner that their directions point towards a point on the symmetry axis 59 of the cylindrical carrier 40. The directions of the suspension elements 48a and 48b intersect one another in the same first point 60 on said axis and the directions of the suspension elements 48c and 48d intersect one another in a similar second point 62 on said axis. Each of the four suspension elements encloses an angle of 45 degrees relative to the cylinder axis 59 of the non-deformed carrier 40.

Figure 5:
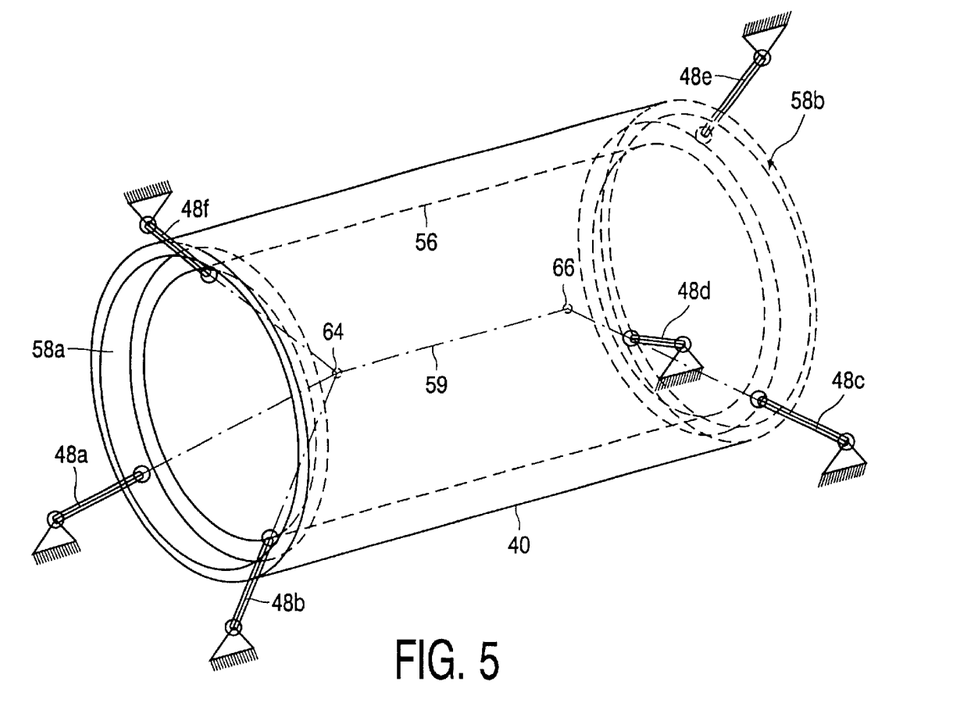
FIG. 5 shows a first embodiment of a cylindrical carrier for a gradient coil system that is suspended by means of six suspension element in accordance with the invention.

FIG. 5 shows a first embodiment of a cylindrical carrier for a gradient coil system that is suspended by means of six suspension elements in accordance with the invention. The suspension elements 48a, 48b and 48f are attached to the thinner portion 58a and the suspension elements 48c, 48d and 48e are attached to the thinner portion 58b. Each of the suspension elements shown may be constructed in the same way as the suspension element 48 described with reference to FIG. 3. The rods 48a, 48b and 48f are directed in such a manner that their directions intersect one another in the same point 64 on the symmetry axis 59 of the cylindrical carrier 40. The rods 48c, 48d and 48e are directed in such a manner that their directions intersect one another in the same point 66 of the symmetry axis 59. In this Figure the double-notch hinges at the ends of the rods serve as ball joints whose stiffness in the directions perpendicular to the longitudinal axes still has a value that is not negligibly small. This is because the carrier 40 would, if this were not the case, still have freedom of rotation around the cylinder axis 59 in the present configuration of suspension elements 48; this freedom of rotation is counteracted by said finite transverse stiffness. Each of the six suspension elements 48a to 48f encloses an angle of 45 degrees relative to the cylinder axis 59 of the non-deformed carrier 40. Moreover, a macroscopic low-frequency movement (for example, of the order of magnitude of 10 Hz) of the carrier 40 is no longer possible either when use is made of this suspension involving six suspension elements.

Figure 6A:
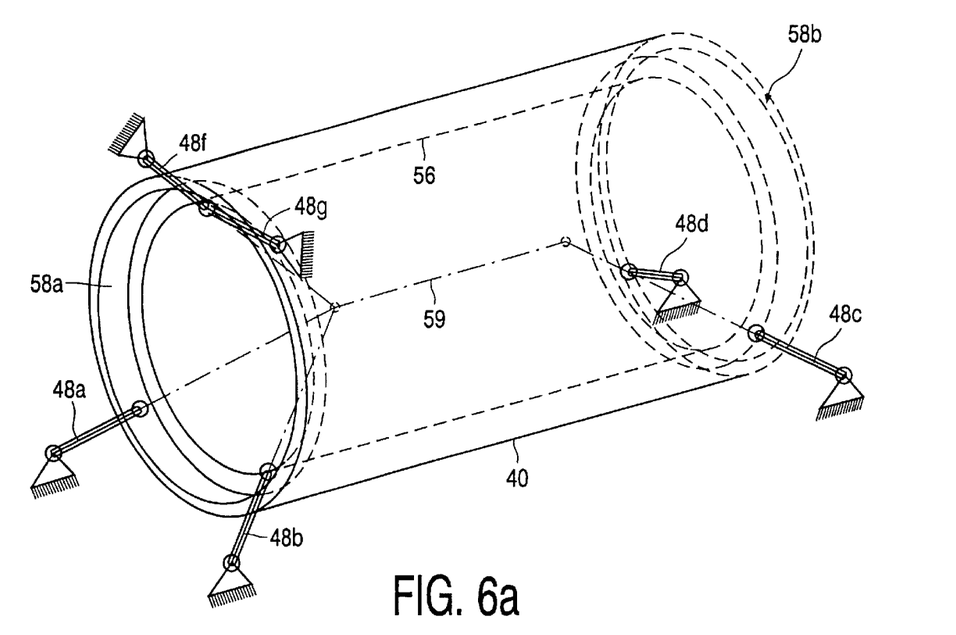
FIGS. 6a, 6b, 6c show a second embodiment of a cylindrical carrier for a gradient coil system that is suspended by means of six suspension elements in accordance with the invention.
Figure 6B:
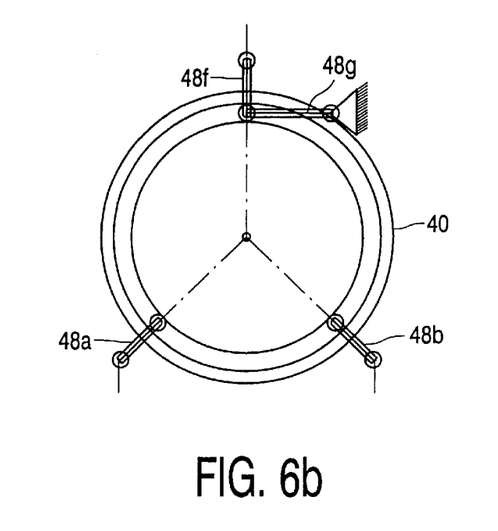
Figure 6C:
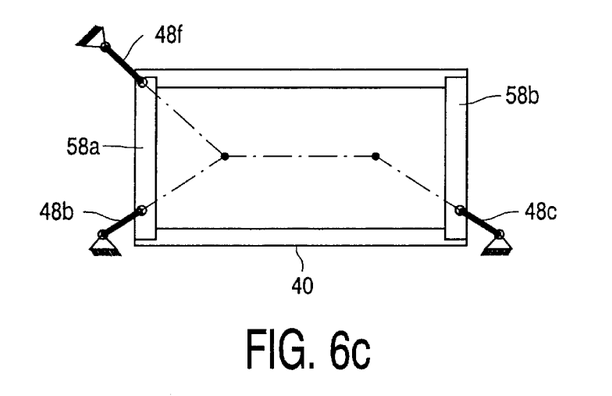

The FIGS. 6a, 6b and 6c illustrate a second embodiment of a cylindrical carrier for a gradient coil system that is suspended by way of six suspension elements in accordance with the invention. FIG. 6a is a perspective general view, FIG. 6b is a front view of the carrier shown in FIG. 6a, and FIG. 6c is a side elevation of the carrier shown in FIG. 6a. It may be assumed that FIG. 6a has been derived from FIG. 5 by omitting the suspension element 48e in the latter Figure and by adding a suspension element 48g. The suspension element 48g is attached to the edge 58a, the point of attachment being situated symmetrically relative to the points of attachment of the suspension elements 48a and 48b; the longitudinal direction of the suspension element 48g extends perpendicularly to the symmetry axis 59, meaning that it is directed exactly tangentially relative to the circle cylinder. The directions of the three suspension elements 48a, 48b and 48f all point towards the point 64 on the cylinder axis 59 of the carrier 40. Each of these three suspension elements encloses an angle of 45 degrees relative to the cylinder axis. The directions of the suspension elements 48c and 48d point both towards the point 66 on the cylinder axis 59. These suspension elements both enclose an angle of 45 degrees relative to the cylinder axis. The ball joints at the ends of the rods in FIG. 6 act as ideal ball joints, meaning that the stiffness in the directions perpendicular to the longitudinal axes has a value that is negligibly small for all practical purposes. In comparison with the embodiment that is shown in FIG. 5, the embodiment that is shown in FIG. 6 ensures that the carrier 40 no longer has freedom of rotation around the cylinder axis 59; this result is due to the selected position and direction of each of the suspension elements. Like in the embodiment that is shown in FIG. 5, a macroscopic low-frequency movement (for example, of the order of magnitude of 10 Hz) of the carrier 40 is no longer possible because of the use of this suspension involving six suspension elements.

Figure 7:
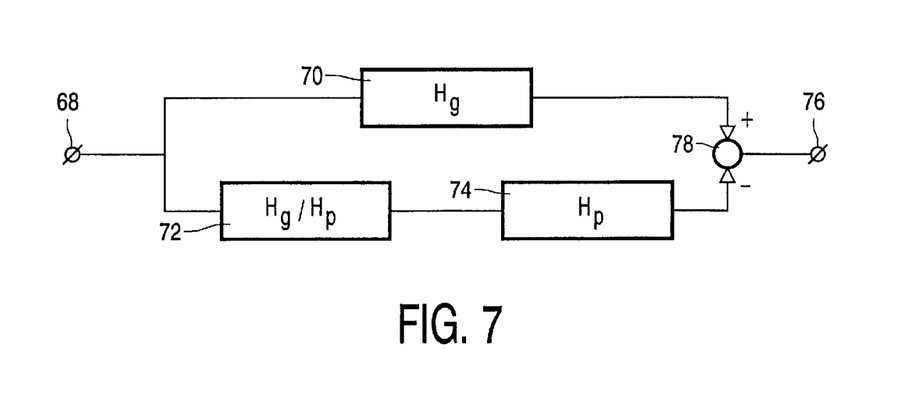
FIG. 7 shows a block diagram illustrating the control behavior of a feed-forward drive of an active drivable element in a suspension element.

FIG. 7 shows a block diagram that represents the control behavior of the feed-forward driving of an active drivable element in a suspension element as shown, for example in the FIGS. 2c and 2d. In this case feed-forward driving is to be understood to mean a kind of control where the vibration behavior of the gradient carrier is predicted in such a manner that the virtual weakening of the suspension element as described with reference to FIG. 2c is achieved. Such a prediction can be made because the signal that drives the gradient coils, and hence makes these coils vibrate, is known in advance.

The input 68 of the block diagram receives the signal that drives the gradient coils (for example, the current through the gradient coil $I_{grad}$). The signal that represents the combined result of the control action and the vibration behavior of the gradient coil under the influence of the gradient current is derived from the output 76 of the block diagram. The block diagram consists of two parallel branches; a first branch consists of a block 70 that constitutes a representation $H_g$ of how the gradient current $I_{grad}$ results in a force that is to be exerted on the suspension element by the point of attachment of the carrier. The block 70 thus represents the dynamic vibration behavior of the carrier 40 (for the frequency to be compensated) that is due to the driving of the gradient coils by way of the gradient current $I_{grad}$.

The second branch of the block diagram consists of a series connection of a first block 72 and a second block 74. The second block 74 forms a representation $H_p$ of the way in which the effect of the piezo actuator on the carrier 40 results in a force that is to be exerted on the suspension element by the point of attachment of the carrier. The block 74 thus represents the dynamic vibration behavior of the carrier 40 (for the frequency to be compensated) that is due to the effect of the force that is exerted on the carrier 40 by the piezo actuator. The first block 20 realizes the actual feed-forward control. The contents of the latter block represent the ratio $H_g/H_p$ of the effect of the gradient current $H_g$ and the effect of the piezo actuator $H_p$ on the carrier 40. The signals produced by the first branch and by the second branch are (algebraically) added to zero under the influence of the latter block 72. The desired control, therefore, is realized by adding the results of the two branches, said addition taking place in the adder 78.

It is to be noted that it is also possible to drive the piezo actuator by means of a feedback circuit. In that case the system that is formed by the feedback circuit and the piezo actuator responds to vibrations that are present at said point of attachment. The vibrations to be compensated can be determined by means of a force sensor that is known per se. The measured force is applied to the piezo actuator, after suitable filtering, with the result that the previously described compensating effect is achieved.

What is claimed is:

1. An apparatus for forming magnetic resonance images, said apparatus comprising:
   a gradient coil system that includes a carrier on which gradient coils are arranged, said gradient coil carrier being attached to a frame of the apparatus by way of connection means and defining a cylindrical axis,
   which connection means are constructed so as to reduce the transfer of mechanical vibrations that are produced by the gradient coil system,
   the connection means include a number of suspension elements, a first end of which is attached to the carrier whereas another end is connected to the frame of the apparatus, said connection means having a first mechanical stiffness in a first direction and a second, smaller stiffness in at least one direction that extends perpendicularly to the first direction, wherein a longitudinal direction of each of said suspension elements forms approximately a 45-degree angle with said cylindrical axis of said carrier in a stationary position,
   each of the first ends of the suspension elements being attached to a point of attachment of the carrier such that this point exhibits at least one low-vibration direction, and
   the connection direction between the first end and the second end of the suspension element being substantially coincident with the low-vibration direction of the point of attachment of the carrier.

2. An apparatus as claimed in claim 1, in which for at least one of said suspension elements the ratio of the axial stiffness to the transverse stiffness is greater than 50:1.

3. An apparatus as claimed in claim 1, in which at least one of said suspension elements is provided with an active drivable element for virtually reducing the stiffness of said suspension element in the axial direction.

4. An apparatus as claimed in claim 3, which apparatus is provided with a drive circuit for driving the active drivable element, which drive circuit includes a feedback circuit that is arranged between a force sensor that is provided at the area of the relevant point of attachment of the carrier and the active drivable element.

5. An apparatus as claimed in claim 3, which apparatus is provided with a gradient control circuit that is intended to produce the signal that generates the gradient field of the apparatus, and also with a drive circuit for driving the active drivable element, which drive circuit includes a feed-forward circuit that is connected between the gradient control circuit and the active drivable element.

6. An apparatus as claimed in claim 1, which apparatus is provided with a cylindrical carrier for the gradient coils, which carrier is attached to four of said suspension elements at a first end and to two further suspension elements of this kind at a second end.

7. An apparatus as claimed in claim 1, in which at least one of said suspension elements is constructed in the form of a rod-shaped element that comprises a thickened central portion.

8. A method of securing a gradient tube assembly to a housing of a diagnostic imaging apparatus, the gradient tube assembly including a gradient coil system that includes a carrier on which gradient coils are arranged, said gradient coil carrier defining a cylindrical axis, the method comprising the steps of:
   providing a number of suspension elements; and
   connecting a first end of each suspension element to the carrier and a second end of each suspension element to a frame of the apparatus, wherein the suspension elements are constructed so as to reduce the transfer of mechanical vibrations that are produced by the gradient coil system by having a first mechanical stifffness in a first direction and a second, smaller stiffness in at least one direction that extends perpendicularly to the first direction, and wherein a longitudinal direction of each suspension element forms approximately a 45-degree angle with the cylindrical axis of the carrier in a stationary position.

* * * * *

UNITED STATES PATENT AND TRADEMARK OFFICE
CERTIFICATE OF CORRECTION

PATENT NO.    : 6,518,761 B2
DATED         : February 11, 2003
INVENTOR(S)   : Nicolaas Bernardus Roozen et al.

It is certified that error appears in the above-identified patent and that said Letters Patent is hereby corrected as shown below:

<u>Title page,</u>
After Inventors, insert -- [73] Assignee: Koninklijke Philips Electronics N.V., Eindhoven (NL) --.

Signed and Sealed this

Second Day of September, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,518,761 B2                                                         Page 1 of 1
DATED        : February 11, 2003
INVENTOR(S)  : Nicolaas Bernardus Roozen, Gerard Van Schothorst and
               Hermanus Mathias Joannes Rene Soemers It is certified that error appears in the above-identified patent and that said Letters Patent is hereby corrected as shown below:

<u>Title page,</u>
After Inventors, insert -- [73] Assignee: Koninklijke Philips Electronics N.V., Eindhoven (NL) --.

Signed and Sealed this

Sixteenth Day of September, 2003

JAMES E. ROGAN
*Director of the United States Patent and Trademark Office*